(12) United States Patent
Kim et al.

(10) Patent No.: US 10,879,191 B2
(45) Date of Patent: Dec. 29, 2020

(54) CONFORMAL SHIELDING FOR SOLDER BALL ARRAY

(71) Applicant: QUALCOMM Incorporated, San Diego, CA (US)

(72) Inventors: Daniel Daeik Kim, Del Mar, CA (US); Manuel Aldrete, Encinitas, CA (US); Babak Nejati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/241,958

(22) Filed: Jan. 7, 2019

(65) Prior Publication Data
US 2020/0219822 A1 Jul. 9, 2020

(51) Int. Cl.
| | | |
|---|---|---|
| *H01L 23/552* | (2006.01) | |
| *H01L 23/00* | (2006.01) | |
| *H05K 1/02* | (2006.01) | |
| *H01L 25/065* | (2006.01) | |
| *H01L 23/538* | (2006.01) | |
| *H01L 25/07* | (2006.01) | |
| *H01L 25/11* | (2006.01) | |

(52) U.S. Cl.
CPC .......... *H01L 23/552* (2013.01); *H01L 23/538* (2013.01); *H01L 24/17* (2013.01); *H01L 24/49* (2013.01); *H01L 25/0652* (2013.01); *H01L 25/0657* (2013.01); *H01L 25/071* (2013.01); *H01L 25/074* (2013.01); *H01L 25/112* (2013.01); *H01L 25/117* (2013.01); *H05K 1/023* (2013.01); *H01L 2224/16227* (2013.01); *H01L 2924/15311* (2013.01)

(58) Field of Classification Search
CPC .................. H01L 25/0652; H01L 23/552
See application file for complete search history.

(56) References Cited

U.S. PATENT DOCUMENTS

| | | |
|---|---|---|
| 8,129,824 B1 | 3/2012 | St. Amand et al. |
| 8,987,889 B2 | 3/2015 | Welch et al. |
| 9,295,157 B2 | 3/2016 | Chen et al. |
| 9,359,191 B2 | 6/2016 | Bolognia et al. |
| 9,419,667 B2 | 8/2016 | Lobianco et al. |
| 2007/0241440 A1 | 10/2007 | Hoang et al. |
| 2011/0084378 A1 | 4/2011 | Welch et al. |
| 2016/0093577 A1 | 3/2016 | Chen et al. |
| 2016/0095218 A1* | 3/2016 | Sakurai ............... H05K 1/0218 361/768 |
| 2017/0092594 A1* | 3/2017 | Song .................... H01L 23/552 |
| 2017/0278830 A1* | 9/2017 | Kim .................... H01L 23/3736 |
| 2018/0228016 A1 | 8/2018 | Kim et al. |

FOREIGN PATENT DOCUMENTS

| | | |
|---|---|---|
| EP | 0634891 A1 | 1/1995 |
| EP | 2405731 A2 | 1/2012 |

* cited by examiner

*Primary Examiner* — Farun Lu
(74) *Attorney, Agent, or Firm* — Qualcomm Incorporated

(57) ABSTRACT

An RF/EMI shield has a substrate, a plurality of solder balls on a first side of the substrate, and a plurality of wire-bonds on a periphery of the first side of the substrate to form a shield which can be soldered in a surface mount process directly around components needing shielding. Each of the plurality of wire-bonds has a width selected as a fraction of the wavelength of interest.

19 Claims, 8 Drawing Sheets

(12)  US 10,879,191 B2

CONFORMAL SHIELDING FOR SOLDER BALL ARRAY

FIELD OF DISCLOSURE

This disclosure relates generally to radio frequency (RF) shielding, and more specifically, but not exclusively, to conformal shielding for solder ball arrays.

BACKGROUND

With the continued miniaturization of electrical circuits and circuit boards, the use of conventional radio frequency (RF) and electromagnetic interference (EMI) shielding has become an increasing challenge. In the past, shields utilized solder balls of the ball grid array (BGA) to provide shielding or added a component such as pre-tinned tabs that were placed through slots in the circuit board to cover a circuit desired to be shielded. The tabs were then twisted to pull the shield tightly against the board and subsequently wave soldered to ensure electrical contact with a shielding ground connection.

As component density increases, the available real estate on a circuit board is at a premium, and designs become more constrained making the use of such conventional shielding techniques even more difficult. There exists a need, therefore, for an improved smaller shielding structure which is cost effective, as compared to the pre-existing shielding techniques, and more efficient.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a RF shielding arrangement includes: a substrate having a first side and a second side opposite the first side; a second integrated circuit device mounted on the second side of the substrate; a first integrated circuit device mounted on the first side of the substrate; a plurality of solder balls on the first side of the substrate proximate to a periphery of the substrate; and a plurality of wire-bonds on the first side of the substrate between the plurality of solder balls and the first integrated circuit device.

In another aspect, a RF shielding arrangement includes: a substrate having a first side and a second side opposite the first side; a second integrated circuit device mounted on the second side of the substrate; a first integrated circuit device mounted on the first side of the substrate; a plurality of solder balls on the first side of the substrate proximate to a periphery of the substrate; and means for shielding on the first side of the substrate between the plurality of solder balls and the first integrated circuit device.

In still another aspect, a method for making a RF shielding arrangement includes: mounting a first integrated circuit device on a first side of a substrate; mounting a second integrated circuit device on a second side of a substrate opposite the first side of the substrate; mounting a plurality of solder balls on the first side of the substrate proximate to a periphery of the substrate; and mounting a plurality of wire-bonds on the first side of the substrate between the plurality of solder balls and the first integrated circuit device.

In still another aspect, a RF shielding arrangement includes: a substrate having a first side and a second side opposite the first side; a second integrated circuit device mounted on the second side of the substrate; a first integrated circuit device mounted on the first side of the substrate; a plurality of solder balls on the first side of the substrate proximate to a periphery of the substrate; and a plurality of wire-bonds on the first side of the substrate between the plurality of solder balls, one of the plurality of wire-bonds between each of proximate ones of the plurality of solder balls.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
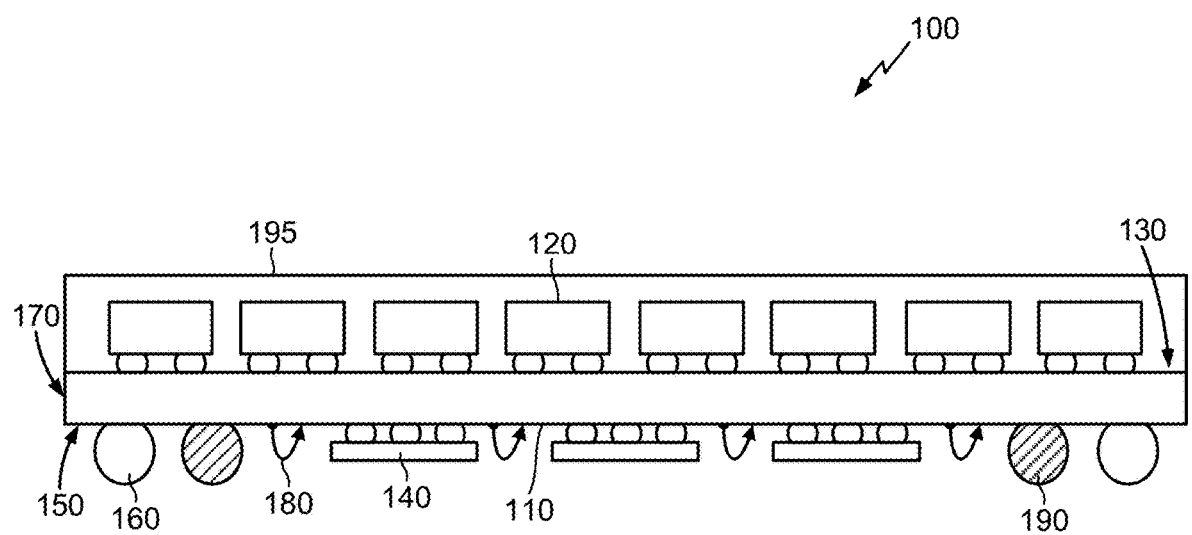
FIG. 1 illustrates a side view of an exemplary RF shielding arrangement in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For example, a wire-bond (e.g. curtain of wire bond material) may implement RF signal and domain barrier more effectively in RF isolation than ball grid array (BGA) ball barrier alone. The wire-bond is also more area efficient than BGA ball barrier. The wire-bond may make contact with printed circuit board (PCB) to strengthen RF isolation and may extend conformal shielding of a double-sided BGA (DSBGA) module to reduce RF leakage. The wire-bond may enable higher IC integration at the bottom side or reduced total module size. Exemplary apparatus and methods may use wire-bonds to isolate: signal vs. signal; signal vs. functional ICs, functional ICs vs. functional ICs; and signal domains.

FIG. 1 illustrates a side view of an exemplary RF shielding arrangement in accordance with some examples of the disclosure. As shown in FIG. 1, a RF shielding arrangement 100 may include a substrate 110 with a first side 150 and a second side 130 opposite the first side 150, a second integrated circuit device 120 mounted on the second side 130 of the substrate 110, a first integrated circuit device 140 mounted on the first side 150 of the substrate 110, a plurality of solder balls 160 on the first side 150 of the substrate 110 proximate to a periphery 170 of the substrate 110, and a plurality of wire-bonds 180 on the first side 150 of the substrate 110 between the plurality of solder balls 160 and the first integrated circuit device 140. While three first integrated circuit devices 140 are shown, it should be understood that more than three or less than three first integrated circuit devices 140 may be mounted on the first side 150 of the substrate 110. While eight second integrated circuit devices 120 are shown, it should be understood that more than eight or less than eight second integrated circuit devices 120 may be mounted on the second side 130 of the substrate 110. The RF shielding arrangement 100 may include a plurality of signal connections 190 (configured to carry signals for the RF shielding arrangement from and to external points or devices) between the plurality of solder balls 160 and the plurality of wire-bonds 180 with the plurality of solder balls 160 configured as ground connections. The RF shielding arrangement 100 may also include an encapsulant 195 enclosing the second integrated circuit device 120 on the second side 130 of the substrate 110.

In addition, the plurality of wire-bonds 180 may be located between proximate ones of the plurality of solder balls 160 in a plane parallel to the first side 150 of the substrate 110. In addition, the RF shielding arrangement 100 may be attached or mounted on a printed circuit board (e.g., not shown but see FIG. 3) proximate to the first side 150 of the substrate 110 and each of the plurality of wire-bonds 180 may be attached to the printed circuit board.

As can be seen in FIG. 1, the wire-bonds 180 are located between the signal connections 190 and the first integrated circuit device 140 as well as between each of the first integrated circuit devices 140. This may allow closer placement of the signal connections and integrated circuit devices since the RF isolation is improved, which will result in more efficient use of the substrate area and smaller substrates/footprints than devices with conventional isolation and footprints. In addition, the wire-bonds 180 implement RF signal and domain barrier isolation, the wire-bonds 180 are more effective in RF isolation than a conventional BGA ball barrier, more area efficient than BGA ball barrier, may make contact with the PCB to strength RF isolation, may extend conformal shielding of a double-sided ball grid array (DSBGA) module to reduce RF leakage, and enable higher integrated circuit integration at the first side 150 or reduced total module size.

Figure 2:
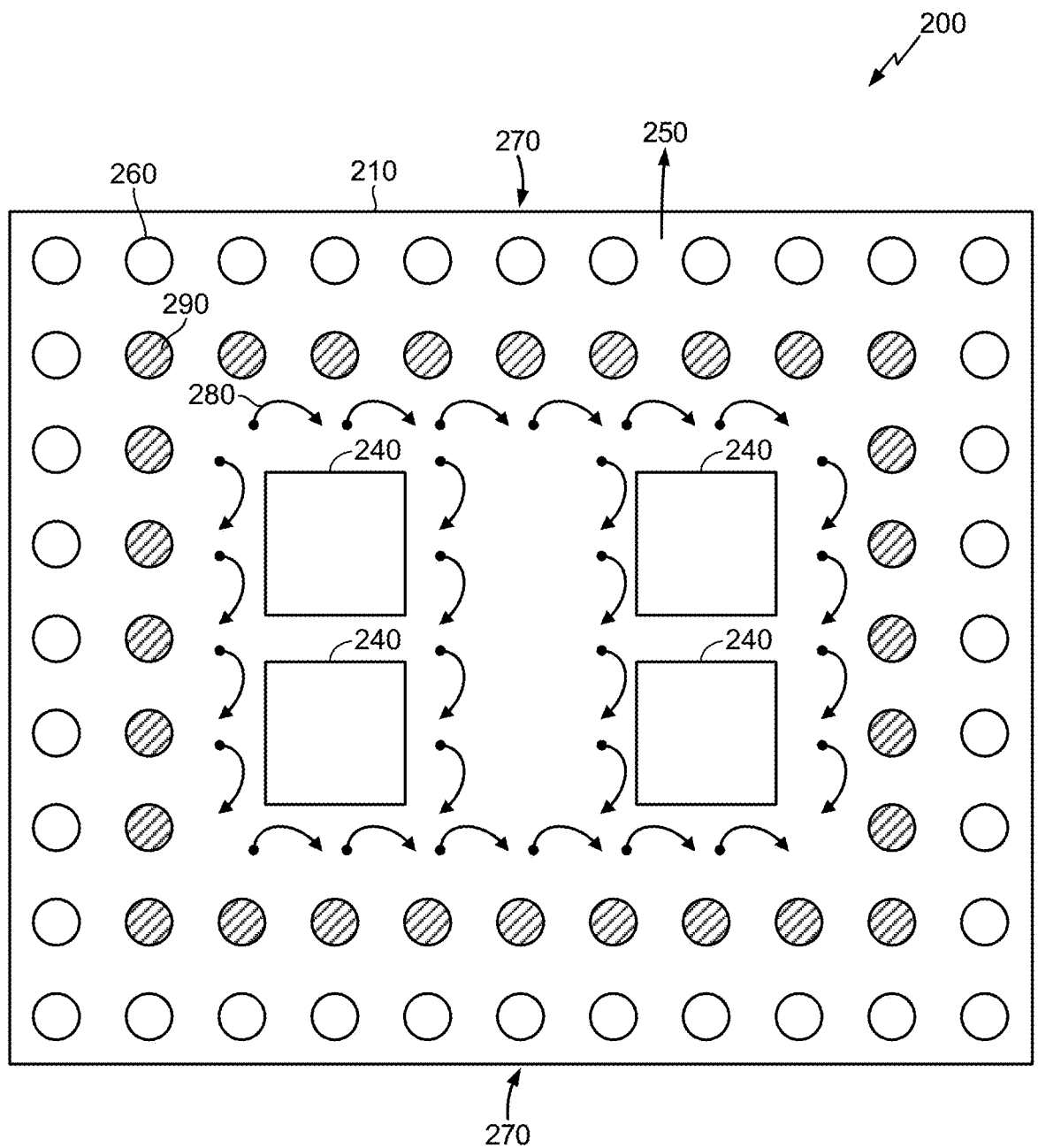
FIG. 2 illustrates a bottom view of an exemplary RF shielding arrangement in accordance with some examples of the disclosure.

FIG. 2 illustrates a bottom view of an exemplary RF shielding arrangement in accordance with some examples of the disclosure. As shown in FIG. 2, a RF shielding arrangement 200 (e.g., RF shielding arrangement 100) may include a substrate 210 with a first side 250, a plurality of first integrated circuit devices 240 mounted on the first side 250 of the substrate 210, a plurality of solder balls 260 on the first side 250 of the substrate 210 proximate to a periphery 270 of the substrate 210, and a plurality of wire-bonds 280 on the first side 250 of the substrate 210 between the plurality of solder balls 260 and the first integrated circuit devices 240 as well as between the first integrated circuit devices 240. While four first integrated circuit devices 240 are shown, it should be understood that more than four or less than four first integrated circuit devices 240 may be mounted on the first side 250 of the substrate 210. The RF shielding arrangement 200 may include a plurality of signal connections 290 (configured to carry signals for the RF shielding arrangement from and to external points or devices) between the plurality of solder balls 260 and the plurality of wire-bonds 280 with the plurality of solder balls 260 configured as ground connections. In addition, the plurality of wire-bonds 280 may be located between proximate ones of the plurality of solder balls 260 in a plane parallel to the first side 250 of the substrate 210.

Figure 3:
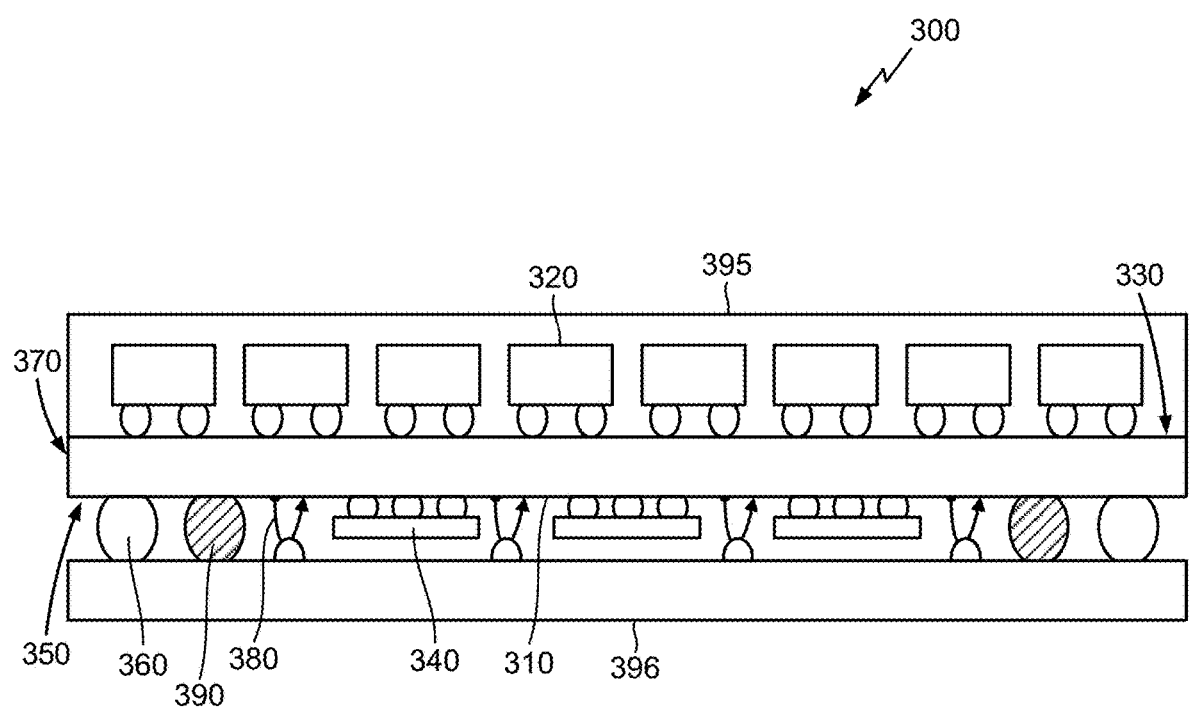
FIG. 3 illustrates a side view of an exemplary RF shielding arrangement with a PCB in accordance with some examples of the disclosure.

FIG. 3 illustrates a side view of an exemplary RF shielding arrangement with a PCB in accordance with some examples of the disclosure. As shown in FIG. 3, a RF shielding arrangement 300 (e.g., RF shielding arrangements 100 and 200) may include a substrate 310 with a first side 350 and a second side 330 opposite the first side 350, a second integrated circuit device 320 mounted on the second side 330 of the substrate 310, a first integrated circuit device 340 mounted on the first side 350 of the substrate 310, a plurality of solder balls 360 on the first side 350 of the substrate 310 proximate to a periphery 370 of the substrate 310, and a plurality of wire-bonds 380 on the first side 350 of the substrate 310 between the plurality of solder balls 360 and the first integrated circuit device 340. While three first integrated circuit devices 340 are shown, it should be understood that more than three or less than three first integrated circuit devices 340 may be mounted on the first side 350 of the substrate 310. While eight second integrated circuit devices 320 are shown, it should be understood that more than eight or less than eight second integrated circuit devices 320 may be mounted on the second side 330 of the substrate 310. The RF shielding arrangement 300 may include a plurality of signal connections 390 (configured to carry signals for the RF shielding arrangement from and to external points or devices) between the plurality of solder balls 360 and the plurality of wire-bonds 380 with the plurality of solder balls 360 configured as ground connections. The RF shielding arrangement 300 may also include an encapsulant 395 enclosing the second integrated circuit device 320 on the second side 330 of the substrate 310.

In addition, the plurality of wire-bonds 380 may be located between proximate ones of the plurality of solder balls 360 in a plane parallel to the first side 350 of the substrate 310. In addition, the RF shielding arrangement 300 may be attached or mounted on a printed circuit board 396 proximate to the first side 350 of the substrate 310 and each of the plurality of wire-bonds 380 may be attached to the printed circuit board 396 using, for example, solder or paste.

As can be seen in FIG. 3, the wire-bonds 380 are located between the signal connections 390 and the first integrated circuit device 340 as well as between each of the first integrated circuit devices 340. This may allow closer placement of the signal connections and integrated circuit devices since the RF isolation is improved, which will result in more efficient use of the substrate area and smaller substrates/footprints than devices with conventional isolation and footprints. In addition, the wire-bonds 380 implement RF signal and domain barrier isolation, the wire-bonds 380 are more effective in RF isolation than a conventional BGA ball barrier, more area efficient than a conventional BGA ball barrier, may make contact with the PCB to strength RF isolation, may extend conformal shielding of a double-sided ball grid array (DSBGA) module to reduce RF leakage, and enable higher integrated circuit integration at the first side 350 or reduced total module size. It should be understood that the plurality of solder balls 360 and the plurality of signal connections 390 may be attached or mounted on the printed circuit board 396 for ground or signal connections, respectively.

Figure 4:
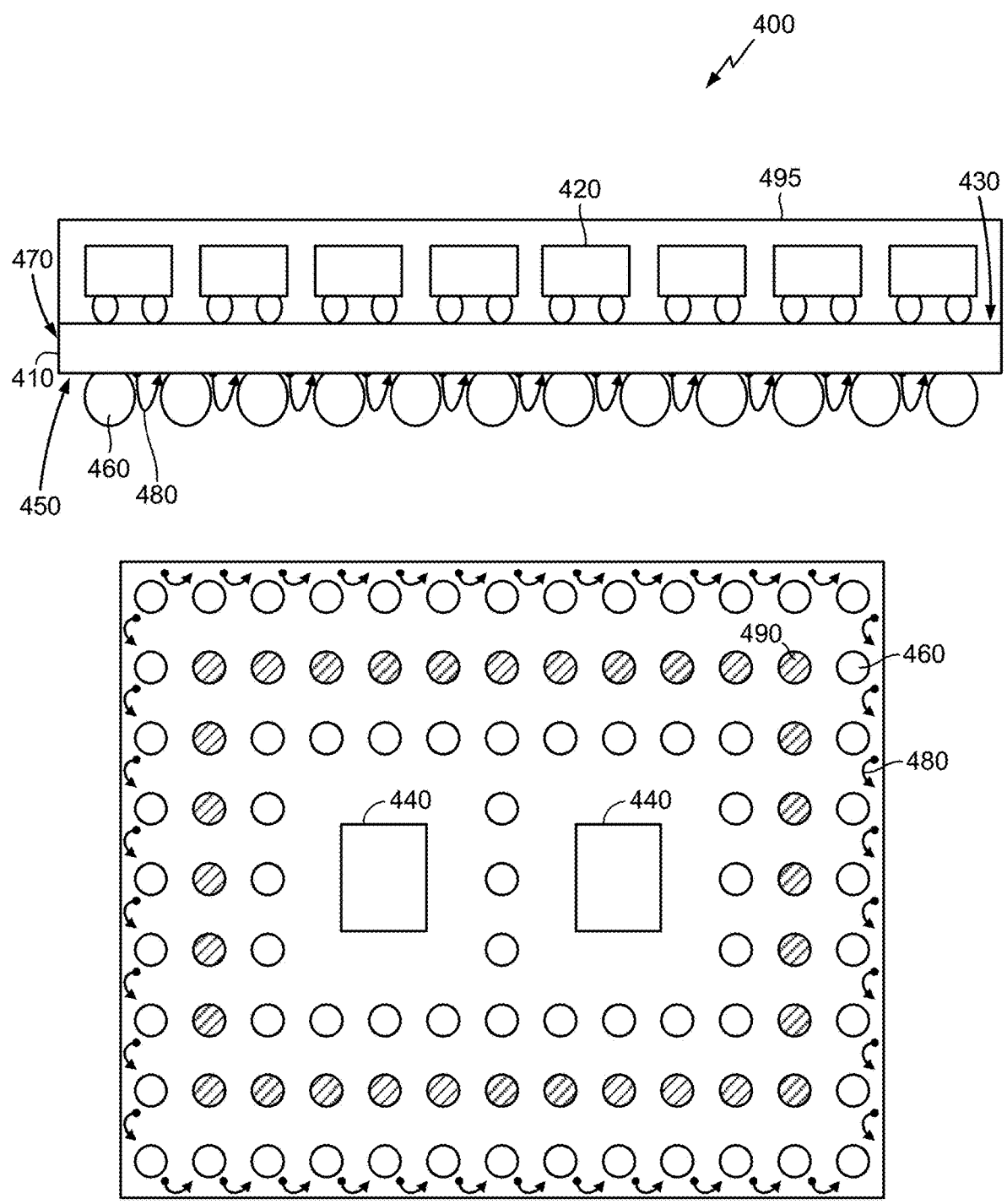
FIG. 4 illustrates a side view and a bottom view of an exemplary RF shielding arrangement with wire-bonds at the periphery in accordance with some examples of the disclosure.

FIG. 4 illustrates a side view and a bottom view of an exemplary RF shielding arrangement with wire-bonds at the periphery in accordance with some examples of the disclosure. As shown in FIG. 4, a RF shielding arrangement 400 (e.g., RF shielding arrangements 100, 200, and 300) may include a substrate 410 with a first side 450 and a second side 430 opposite the first side 450, a second integrated circuit device 420 mounted on the second side 430 of the substrate 410, a first integrated circuit device 440 mounted on the first side 450 of the substrate 410, a plurality of solder balls 460 on the first side 450 of the substrate 410 proximate to a periphery 470 of the substrate 410, and a plurality of wire-bond wires 480 on the first side 450 of the substrate 410 between the plurality of solder balls 460. While only one such wire-bond wire 480 is shown, it should be understood that another wire-bond wire 480 may be used in place of the solder balls 460 that surround the first integrated circuit device 440 to provide additional isolation. While two first integrated circuit devices 440 are shown, it should be understood that more than two or less than two first integrated circuit devices 440 may be mounted on the first side 450 of the substrate 410. While eight second integrated circuit devices 420 are shown, it should be understood that more than eight or less than eight second integrated circuit devices 420 may be mounted on the second side 430 of the substrate 410. The RF shielding arrangement 400 may include a plurality of signal connections 490 (configured to carry signals for the RF shielding arrangement from and to external points or devices) between the plurality of solder balls 460 and the first integrated circuit devices 440 with the plurality of solder balls 460 configured as ground connections. The RF shielding arrangement 400 may also include an encapsulant 495 enclosing the second integrated circuit device 420 on the second side 430 of the substrate 410.

In addition, the plurality of wire-bonds 480 may be located between proximate ones of the plurality of solder balls 460. In addition, the RF shielding arrangement 400 may be attached or mounted on a printed circuit board (e.g., not shown but see FIG. 3) proximate to the first side 450 of the substrate 410 and each of the plurality of wire-bonds 480 may be attached to the printed circuit board.

As can be seen in FIG. 4, the wire-bonds 480 are located between adjacent or proximate solder balls 460. This may allow closer placement of the signal connections and integrated circuit devices since the RF isolation is improved by a constant ground wire-bond wire on the periphery 470, which will result in more efficient use of the substrate area and smaller substrates/footprints than devices with conventional isolation and footprints. In addition, the wire-bonds 480 implement RF signal and domain barrier isolation, the wire-bonds 480 are more effective in RF isolation than a conventional BGA ball barrier, more area efficient than a conventional BGA ball barrier, may make contact with the PCB to strength RF isolation, may extend conformal shielding of a double-sided ball grid array (DSBGA) module to reduce RF leakage, and enable higher integrated circuit integration at the first side 450 or reduced total module size. Alternatively, the wire-bonds 480 may replace the outermost solder balls 460 or be outside the solder balls 460 on the periphery 470 to provide complete shielding for the RF shielding arrangement 400.

Figure 5:
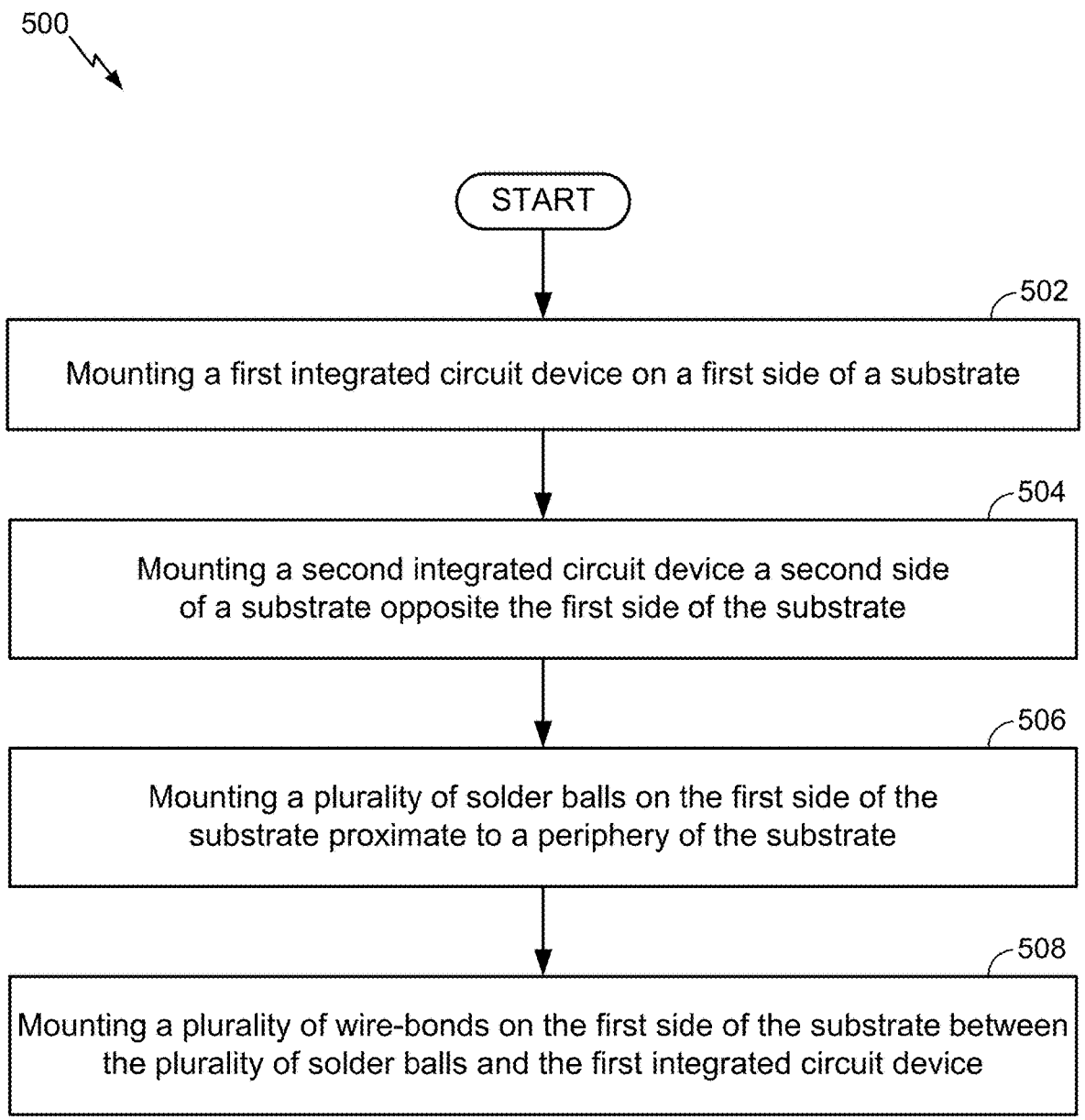
FIG. 5 illustrates an exemplary partial method for shielding integrated circuit devices in accordance with some examples of the disclosure.

FIG. 5 illustrates an exemplary partial method 500 for shielding integrated circuit devices in accordance with some examples of the disclosure. The partial method 500 begins in block 502 with mounting a first integrated circuit device on a first side of a substrate. The partial method 500 continues in block 504 with mounting a second integrated circuit device on a second side of a substrate opposite the first side of the substrate. The partial method 500 continues in block 506 with mounting a plurality of solder balls on the first side of the substrate proximate to a periphery of the substrate. The partial method 500 may conclude in block 508 with mounting a plurality of wire-bonds on the first side of the substrate between the plurality of solder balls and the first integrated circuit device. Alternatively, the partial method 500 may include mounting a first plurality of signal connections between the plurality of solder balls and the plurality of wire-bonds and wherein the plurality of solder balls are configured as ground connections; mounting the first side of the substrate to a printed circuit board and mounting each of the plurality of wire-bonds to the printed circuit board; and enclosing the second integrated circuit device on the second side of the substrate with an encapsulant.

It will be appreciated that various aspects disclosed herein can be described as functional equivalents to the structures, materials and/or devices described and/or recognized by those skilled in the art. For example, in one aspect, a RF shielding arrangement may comprise a substrate (e.g., substrates 110, 210, 310, and 410) having a first side and a second side opposite the first side; a second integrated circuit device (e.g., second integrated circuit devices 120, 320, and 420) mounted on the second side of the substrate; a first integrated circuit device (e.g., first integrated circuit devices 140, 240, 340, and 440) mounted on the first side of the substrate; a plurality of solder balls (e.g., solder balls 160, 260, 360, and 460) on the first side of the substrate proximate to a periphery of the substrate; and means for shielding (e.g., wire-bonds 180, 280, 380, and 480) on the first side of the substrate between the plurality of solder balls and the first integrated circuit device. It will be appreciated that the aforementioned aspects are merely provided as examples and the various aspects claimed are not limited to the specific references and/or illustrations cited as examples.

The wire-bond (e.g., wire-bond 180, 280, 380, and 480) may provide better isolation than the balls in the BGA since the pitch for the balls in the BGA are typically 400 micro-meters while the wire-bonds of the wire-bond may have a smaller pitch, such as 90 micro-meters. In addition, the wire-bonds may be a loop with both ends attached or mounted to the substrate (using pads, solder, or other suitable mechanisms) and the width of the loop configured to be less than the wavelength of the frequency of interest (the frequency that is being blocked). The wire-bonds may have other shapes than a loop and may comprise suitable conductive material to provide the desired RF isolation. The height of the wire-bonds may be configured such that it is approximately equal to the height of the solder balls. The wire-bond may be grounded or not through the substrate (or PCB is attached to the PCB). In addition, the wire-bond may be configured to provide a u-shaped cage around the first integrated circuit devices enclosing the sides and the bottom except for the top side attached to the substrate. In addition, two separate wire-bonds may be used each having a different pitch or width and height dimensions. For example, one wire-bond may be configured for one frequency range and the other wire-bond may be configured for another frequency range.

Figure 6:
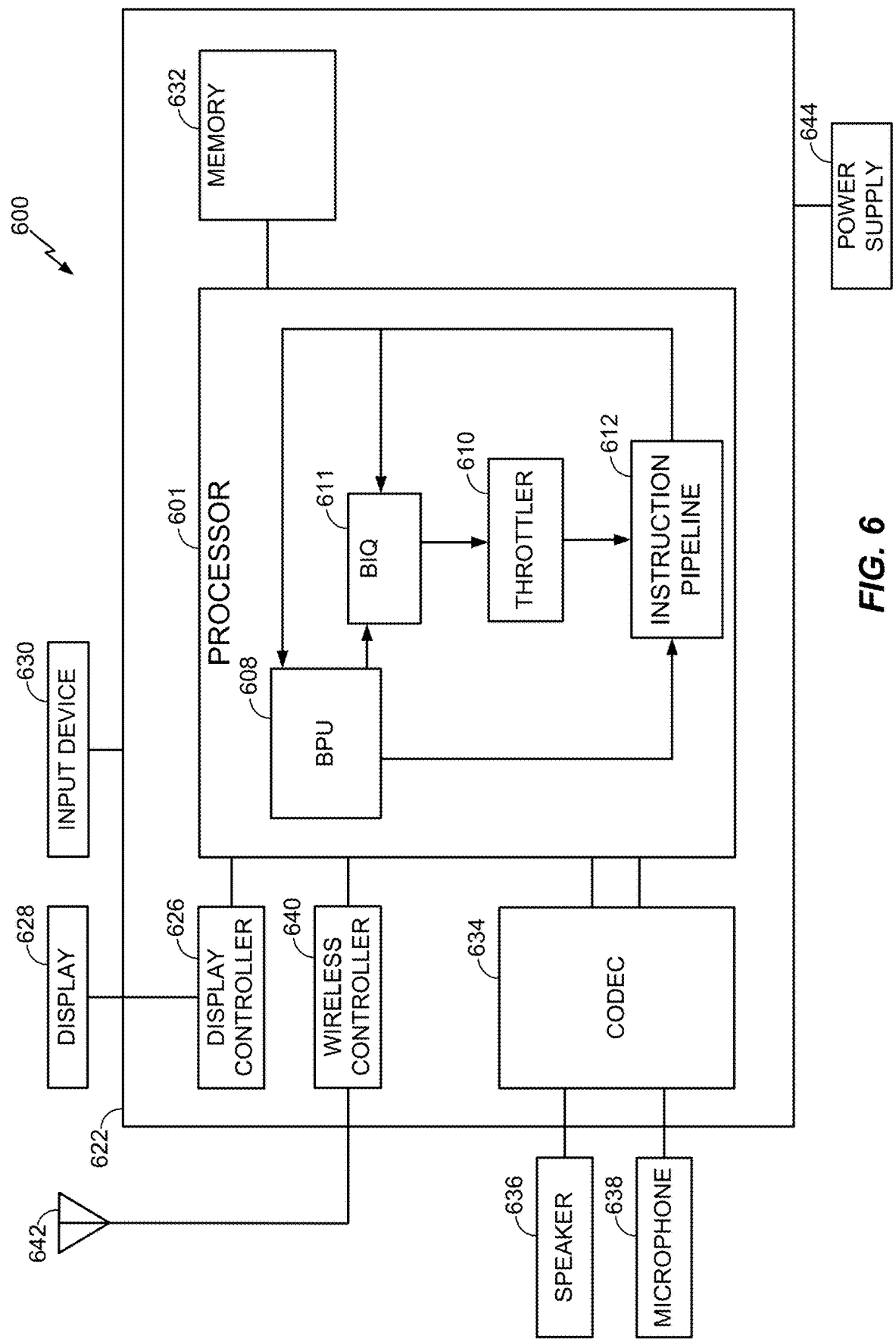
FIG. 6 illustrates an exemplary mobile device in accordance with some examples of the disclosure.

FIG. 6 illustrates an exemplary mobile device in accordance with some examples of the disclosure. Referring now to FIG. 6, a block diagram of a mobile device that is configured according to exemplary aspects is depicted and generally designated 600. In some aspects, mobile device 600 may be configured as a wireless communication device. As shown, mobile device 600 includes processor 601, which may be configured to implement the methods described herein in some aspects. Processor 601 is shown to comprise instruction pipeline 612, buffer processing unit (BPU) 608, branch instruction queue (BIQ) 611, and throttler 610 as is well known in the art. Other well-known details (e.g., counters, entries, confidence fields, weighted sum, comparator, etc.) of these blocks have been omitted from this view of processor 601 for the sake of clarity.

Processor 601 may be communicatively coupled to memory 632 over a link, which may be a die-to-die or chip-to-chip link. Mobile device 600 also include display 628 and display controller 626, with display controller 626 coupled to processor 601 and to display 628.

In some aspects, FIG. 6 may include coder/decoder (CODEC) 634 (e.g., an audio and/or voice CODEC) coupled to processor 601; speaker 636 and microphone 638 coupled to CODEC 634; and wireless controller 640 (which may include a modem) coupled to wireless antenna 642 and to processor 601.

In a particular aspect, where one or more of the above-mentioned blocks are present, processor 601, display controller 626, memory 632, CODEC 634, and wireless controller 640 can be included in a system-in-package or system-on-chip device 622. Input device 630 (e.g., physical or virtual keyboard), power supply 644 (e.g., battery), display 628, speaker 636, microphone 638, and wireless antenna 642, may be external to system-on-chip device 622 and may be coupled to a component of system-on-chip device 622, such as an interface or a controller.

It should be noted that although FIG. 6 depicts a mobile device 600, processor 601 and memory 632 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
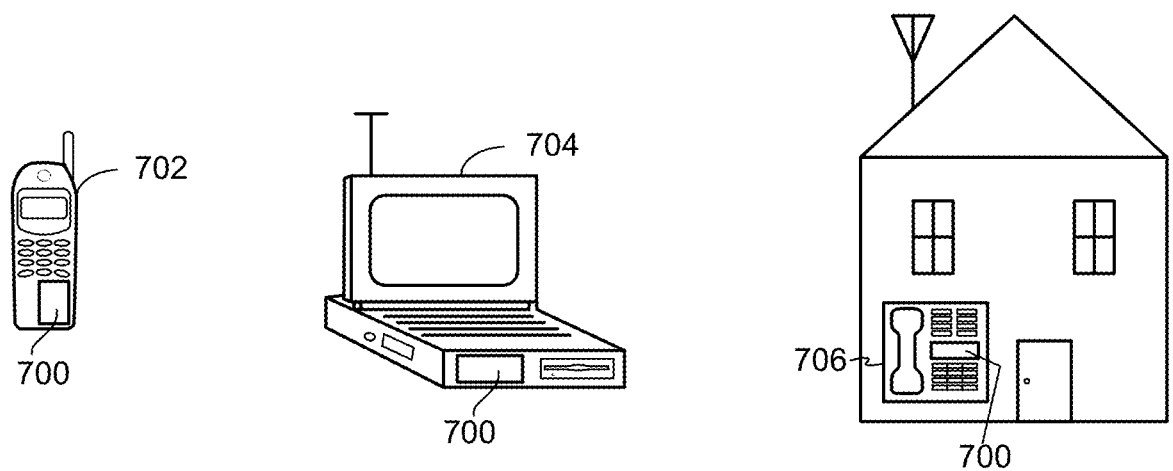
FIG. 7 illustrates various electronic devices that may be integrated with any of the aforementioned integrated devices, semiconductor device, integrated circuit, die, interposer, package or package-on-package (PoP) in accordance with some examples of the disclosure.

FIG. 7 illustrates various electronic devices that may be integrated with any of the aforementioned RF shielding arrangements in accordance with some examples of the disclosure. For example, a mobile phone device 702, a laptop computer device 704, and a fixed location terminal device 706 may include an integrated device 700 as described herein. The integrated device 700 may be, for example, any of the integrated circuits, dies, integrated devices, integrated device packages, integrated circuit devices, device packages, integrated circuit (IC) packages, package-on-package devices described herein. The devices 702, 704, 706 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Figure 8:
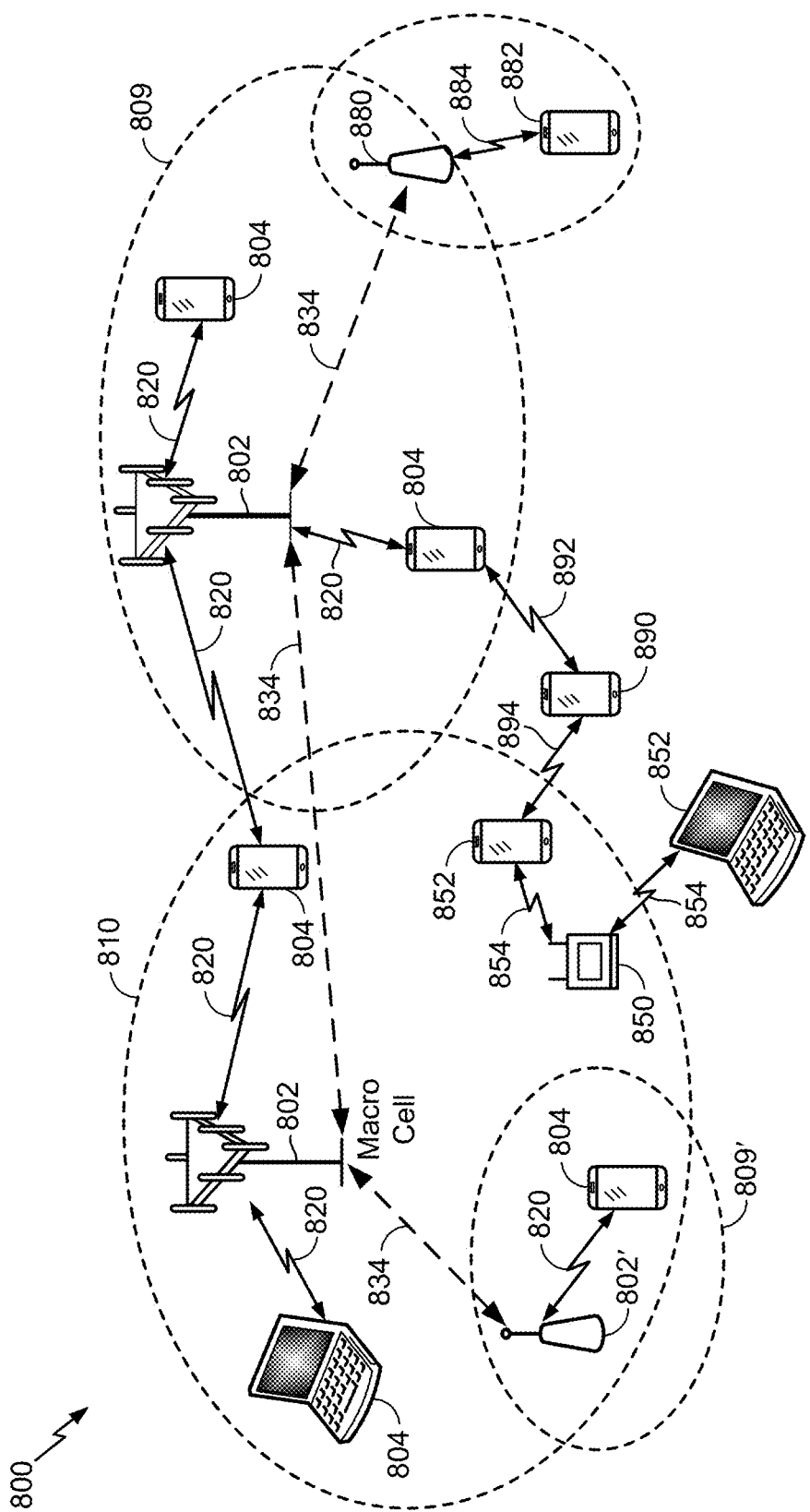
FIG. 8 illustrates an exemplary wireless communications system in accordance with some examples of the disclosure.

According to various aspects, FIG. 8 illustrates an exemplary wireless communications system 800 that may be used with the concepts described herein. The wireless communications system 800 (which may also be referred to as a wireless wide area network (WWAN)) may include various base stations 802 and various UEs 804. The base stations 802 may include macro cells (high power cellular base stations) and/or small cells (low power cellular base stations), wherein the macro cells may include Evolved NodeBs (eNBs), where the wireless communications system 800 corresponds to an LTE network, or gNodeBs (gNBs), where the wireless communications system 800 corresponds to a 5G network or a combination of both, and the small cells may include femtocells, picocells, microcells, etc.

The base stations 802 may collectively form a Radio Access Network (RAN) and interface with an Evolved Packet Core (EPC) or Next Generation Core (NGC) through backhaul links. In addition to other functions, the base stations 802 may perform functions that relate to one or more of transferring user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, RAN sharing, multimedia broadcast multicast service (MBMS), subscriber and equipment trace, RAN information management (RIM), paging, positioning, and delivery of warning messages. The base stations 802 may communicate with each other directly or indirectly (e.g., through the EPC/NGC) over backhaul links 834, which may be wired or wireless.

The base stations 802 may wirelessly communicate with the UEs 804. Each of the base stations 802 may provide communication coverage for a respective geographic coverage area 809. In an aspect, although not shown in FIG. 8, coverage areas 809 may be subdivided into a plurality of cells (e.g., three), or sectors, each cell corresponding to a single antenna or array of antennas of a base station 802. As used herein, the term "cell" or "sector" may correspond to one of a plurality of cells of a base station 802, or to the base station 802 itself, depending on the context.

While neighboring macro cell geographic coverage areas 809 may partially overlap (e.g., in a handover region), some of the geographic coverage areas 809 may be substantially overlapped by a larger geographic coverage area 810. For example, a small cell base station 802' may have a coverage area 809' that substantially overlaps with the coverage area 809 of one or more macro cell base stations 802. A network that includes both small cell and macro cells may be known as a heterogeneous network. A heterogeneous network may also include Home eNBs (HeNBs), which may provide service to a restricted group known as a closed subscriber group (CSG). The communication links 820 between the base stations 802 and the UEs 804 may include uplink (UL) (also referred to as reverse link) transmissions from a UE 804 to a base station 802 and/or downlink (DL) (also referred to as forward link) transmissions from a base station 802 to a UE 804. The communication links 820 may use MIMO antenna technology, including spatial multiplexing, beamforming, and/or transmit diversity. The communication links may be through one or more carriers. Allocation of carriers may be asymmetric with respect to DL and UL (e.g., more or less carriers may be allocated for DL than for UL).

The wireless communications system 800 may further include a wireless local area network (WLAN) access point (AP) 850 in communication with WLAN stations (STAs) 852 via communication links 854 in an unlicensed frequency spectrum (e.g., 5 GHz). When communicating in an unlicensed frequency spectrum, the WLAN STAs 852 and/or the WLAN AP 850 may perform a clear channel assessment (CCA) prior to communicating in order to determine whether the channel is available.

The small cell base station 802' may operate in a licensed and/or an unlicensed frequency spectrum. When operating in an unlicensed frequency spectrum, the small cell base station 802' may employ LTE or 5G technology and use the same 5 GHz unlicensed frequency spectrum as used by the WLAN AP 850. The small cell base station 802', employing LTE/5G in an unlicensed frequency spectrum, may boost coverage to and/or increase capacity of the access network. LTE in an unlicensed spectrum may be referred to as LTE-unlicensed (LTE-U), licensed assisted access (LAA), or MulteFire.

The wireless communications system 800 may further include a mmW base station 880 that may operate in mmW frequencies and/or near mmW frequencies in communication with a UE 882. Extremely high frequency (EHF) is part of the RF in the electromagnetic spectrum. EHF has a range of 30 GHz to 300 GHz and a wavelength between 1 millimeter and 10 millimeters. Radio waves in this band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band have high path loss and a relatively short range. The mmW base station 880 may utilize beamforming 884 with the UE 882 to compensate for the extremely high path loss and short range. Further, it will be appreciated that in alternative configurations, one or more base stations 802 may also transmit using mmW or near mmW and beamforming. Accordingly, it will be appreciated that the foregoing illustrations are merely examples and should not be construed to limit the various aspects disclosed herein.

The wireless communications system 800 may further include one or more UEs, such as UE 890, that connects indirectly to one or more communication networks via one or more device-to-device (D2D) peer-to-peer (P2P) links. In the embodiment of FIG. 8, UE 890 has a D2D P2P link 892 with one of the UEs 804 connected to one of the base stations 802 (e.g., through which UE 890 may indirectly obtain cellular connectivity) and a D2D P2P link 894 with WLAN STA 852 connected to the WLAN AP 850 (through which UE 890 may indirectly obtain WLAN-based Internet connectivity). In an example, the D2D P2P links 892-894 may be supported with any well-known D2D radio access technology (RAT), such as LTE Direct (LTE-D), WiFi Direct (WiFi-D), Bluetooth, and so on.

One or more of the components, processes, features, and/or functions illustrated in FIGS. 1-8 may be rearranged and/or combined into a single component, process, feature or function or incorporated in several components, processes, or functions. Additional elements, components, processes, and/or functions may also be added without departing from the disclosure. It should also be noted that FIGS. 1-8 and its corresponding description in the present disclosure is not limited to dies and/or ICs. In some implementations, FIGS. 1-8 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or other such configurations). Additionally, these sequence of actions described herein can be considered to be incorporated entirely within any form of computer-readable storage medium having stored therein a corresponding set of computer instructions that upon execution would cause an associated processor to perform the functionality described herein. Thus, the various aspects of the disclosure may be incorporated in a number of different forms, all of which have been contemplated to be within the scope of the claimed subject matter. In addition, for each of the examples described herein, the corresponding form of any such examples may be described herein as, for example, "logic configured to" perform the described action.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A RF shielding arrangement, comprising:
    a substrate having a first side and a second side opposite the first side;
    a second integrated circuit device mounted on the second side of the substrate, wherein the second side of the substrate is a top side of the substrate;
    a first integrated circuit device mounted on the first side of the substrate, wherein the first side of the substrate is a bottom side of the substrate;
    a plurality of solder balls configured as ground connection on the first side of the substrate proximate to a periphery of the substrate;
    a plurality of wire-bonds on the first side of the substrate between the plurality of solder balls and the first integrated circuit device; and
    a first plurality of signal connections between the plurality of solder balls and the plurality of wire-bonds.

2. The RF shielding arrangement of claim 1, wherein the first integrated circuit device comprises a plurality of first integrated circuit devices and wherein the plurality of wire-bonds separates each of the plurality of first integrated circuit devices from each other of the first integrated circuit devices.

3. The RF shielding arrangement of claim 1, wherein the plurality of wire-bonds are located between proximate ones of the plurality of solder balls in a plane parallel to the first side of the substrate.

4. The RF shielding arrangement of claim 1, further comprising a printed circuit board proximate to the first side of the substrate and wherein each of the plurality of wire-bonds is attached to the printed circuit board.

5. The RF shielding arrangement of claim 1, wherein the second integrated circuit device comprises a plurality of second integrated circuit devices mounted on the second side of the substrate.

6. The RF shielding arrangement of claim 1, further comprising an encapsulant enclosing the second integrated circuit device on the second side of the substrate.

7. The RF shielding arrangement of claim 1, wherein the RF shielding arrangement is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

8. The RF shielding arrangement of claim 1, wherein a first end of each one of the plurality of wire-bonds is connected to the substrate and a second end of each one of the plurality of wire-bonds is connected to the substrate, in a loop configuration.

9. The RF shielding arrangement of claim 8, wherein a width of the loop configuration is less than a wavelength of a frequency configured to be shielded.

10. The RF shielding arrangement of claim 9, wherein the plurality of wire-bonds are grounded through the substrate.

11. The RF shielding arrangement of claim 9, wherein a height of the plurality of wire-bonds is approximately equal to the height of the plurality of solder balls.

12. The RF shielding arrangement of claim 1,
    wherein the plurality of wire-bonds are located between the signal connections and the first integrated device, and wherein the first integrated circuit device comprises a plurality of first integrated circuit devices and the plurality of wire-bonds are located between each of the plurality of first integrated circuit devices.

13. A method for making a RF shielding arrangement, the method comprising:
  mounting a first integrated circuit device on a first side of a substrate, wherein the first side of the substrate is a bottom side of the substrate;
  mounting a second integrated circuit device on a second side of the substrate opposite the first side of the substrate, wherein the second side of the substrate is a top side of the substrate;
  mounting a plurality of solder balls configured as a ground connection on the first side of the substrate proximate to a periphery of the substrate;
  mounting a plurality of wire-bonds on the first side of the substrate between the plurality of solder balls and the first integrated circuit device; and
  mounting a first plurality of signal connections between the plurality of solder balls and the plurality of wire-bonds.

14. The method for making a RF shielding arrangement of claim 13, wherein the first integrated circuit device comprises a plurality of first integrated circuit devices and wherein the plurality of wire-bonds separates each of the plurality of first integrated circuit devices from each other of the first integrated circuit devices.

15. The method for making a RF shielding arrangement of claim 13, wherein the plurality of wire-bonds are located between proximate ones of the plurality of solder balls in a plane parallel to the first side of the substrate.

16. The method for making a RF shielding arrangement of claim 13, further comprising mounting the first side of the substrate to a printed circuit board and mounting each of the plurality of wire-bonds to the printed circuit board.

17. The method for making a RF shielding arrangement of claim 13, wherein the second integrated circuit device comprises a plurality of second integrated circuit devices mounted on the second side of the substrate.

18. The method for making a RF shielding arrangement of claim 13, further comprising enclosing the second integrated circuit device on the second side of the substrate with an encapsulant.

19. The method for making a RF shielding arrangement of claim 13, wherein the method is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *